US011757369B1

(12) United States Patent
Scheller et al.

(10) Patent No.: US 11,757,369 B1
(45) Date of Patent: Sep. 12, 2023

(54) APPARATUS, SYSTEM, AND METHOD FOR OPTICALLY TRANSFORMING AC ELECTRICAL INPUTS INTO STEPPED-DOWN DC OUTPUTS

(71) Applicant: META PLATFORMS TECHNOLOGIES, LLC, Menlo Park, CA (US)

(72) Inventors: Maik Andre Scheller, Redmond, WA (US); Jonathan Robert Peterson, Woodinville, WA (US); Andrew John Ouderkirk, Redmond, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 265 days.

(21) Appl. No.: 16/775,607

(22) Filed: Jan. 29, 2020

Related U.S. Application Data

(60) Provisional application No. 62/900,672, filed on Sep. 16, 2019.

(51) Int. Cl.
*H02M 7/06* (2006.01)
*H02M 7/00* (2006.01)

(52) U.S. Cl.
CPC .................. *H02M 7/06* (2013.01); *H02M 7/003* (2013.01)

(58) Field of Classification Search
CPC .............................................. H02M 7/02-7/40
See application file for complete search history.

(56) References Cited

U.S. PATENT DOCUMENTS

| 4,730,115 | A | 3/1988 | Abe |
| 5,248,931 | A | 9/1993 | Flesner et al. |
| 6,265,653 | B1 | 7/2001 | Haigh et al. |
| | | (Continued) | |

FOREIGN PATENT DOCUMENTS

| DE | 102019103805 | A1* | 8/2020 | ................. A01G 7/045 |
| FR | 2 525 831 | A1 | 10/1983 | |
| | | (Continued) | | |

OTHER PUBLICATIONS

"Opto-Isolator - Wikipedia," May 5, 2018, [Retrieved on Nov. 18, 2021], 4 pages, Retrieved from the Internet: https://en.wikipedia.org/wiki/Optical_isolator.
Helmers H., et al., "Photovoltaic Cells with Increased Voltage Output for Optical Power Supply of Sensor Electronics," 7th International Conference on Sensors and Measurement Technology, May 2015, 6 pages.
International Preliminary Report on Patentability for International Application No. PCT/US2020/047557, mailed Mar. 31, 2022, 9 pages.

(Continued)

*Primary Examiner* — Peter M Novak
(74) *Attorney, Agent, or Firm* — Greenberg Traurig, LLP

(57) ABSTRACT

A step-down optical AC/DC transformer may include (1) an array of light-emitting devices that are disposed to be electrically coupled to an alternating current (AC) power source are connected in series with one another and (2) an array of photovoltaic cells that are optically coupled to the array of light-emitting devices and produce a direct current (DC) electrical output. Various other apparatuses, systems, and methods are also disclosed.

17 Claims, 9 Drawing Sheets

(56) References Cited

U.S. PATENT DOCUMENTS

| | | | |
|---|---|---|---|
| 6,304,428 B1* | 10/2001 | Sato | B41J 29/02 312/223.2 |
| 6,316,715 B1 | 11/2001 | King et al. | |
| 6,359,210 B2 | 3/2002 | Ho et al. | |
| 7,941,022 B1* | 5/2011 | Schaffner et al. | G02B 6/03633 385/127 |
| 10,499,466 B1* | 12/2019 | Miskin et al. | F21V 23/0414 |
| 2002/0153037 A1 | 10/2002 | Fischer | |
| 2010/0189134 A1* | 7/2010 | Ying | H04L 12/10 370/489 |
| 2011/0209761 A1 | 9/2011 | Counil et al. | |
| 2013/0119409 A1 | 5/2013 | Zhao | |
| 2014/0061679 A1 | 3/2014 | Guo | |
| 2021/0083141 A1 | 3/2021 | Scheller et al. | |

FOREIGN PATENT DOCUMENTS

JP         2002034176 A *   1/2002

OTHER PUBLICATIONS

International Preliminary Report on Patentability for International Application No. PCT/US2021/046057, mailed Mar. 2, 2023, 10 pages.

International Search Report and Written Opinion for International Application No. PCT/US2021/046057,mailed Nov. 15, 2021, 11 pages.

International Search Report and Written Opinion received for PCT Application Serial No. PCT/US2020/047557 dated Nov. 11, 2020, 11 pages.

Non-Final Office Action mailed Dec. 27, 2021 for U.S. Appl. No. 16/841,519 filed Apr. 6, 2020, 15 pages.

Non-Final Office Action mailed Jul. 28, 2022 for U.S. Appl. No. 16/841,519, filed Apr. 6, 2020, 21 pages.

Notice of Allowance mailed Apr. 20, 2022 for U.S. Appl. No. 16/996,588, filed Aug. 18, 2020, 09 pages.

Notice of Allowance mailed Jul. 29, 2022 for U.S. Appl. No. 16/996,588, filed Aug. 18, 2020, 2 pages.

Restriction Requirement mailed Aug. 20, 2021 for U.S. Appl. No. 16/841,519, filed Apr. 6, 2020, 9 Pages.

Silvestre et al., "Study of bypass diodes configuration on PV modules", Applied Energy, Vol. 86, Issue 9, 2009, pp. 1632-1640.

* cited by examiner

APPARATUS, SYSTEM, AND METHOD FOR OPTICALLY TRANSFORMING AC ELECTRICAL INPUTS INTO STEPPED-DOWN DC OUTPUTS

CROSS-REFERENCE TO RELATED APPLICATION

This application claims the benefit of priority under 35 U.S.C. §119(e) to U.S. Provisional Application No. 62/900,672, filed Sep. 16, 2019, the contents of which are incorporated herein by reference in their entirety.

BRIEF DESCRIPTION OF THE DRAWINGS

The accompanying drawings illustrate a number of exemplary embodiments and are a part of the specification. Together with the following description, these drawings demonstrate and explain various principles of the present disclosure.

Figure 1:
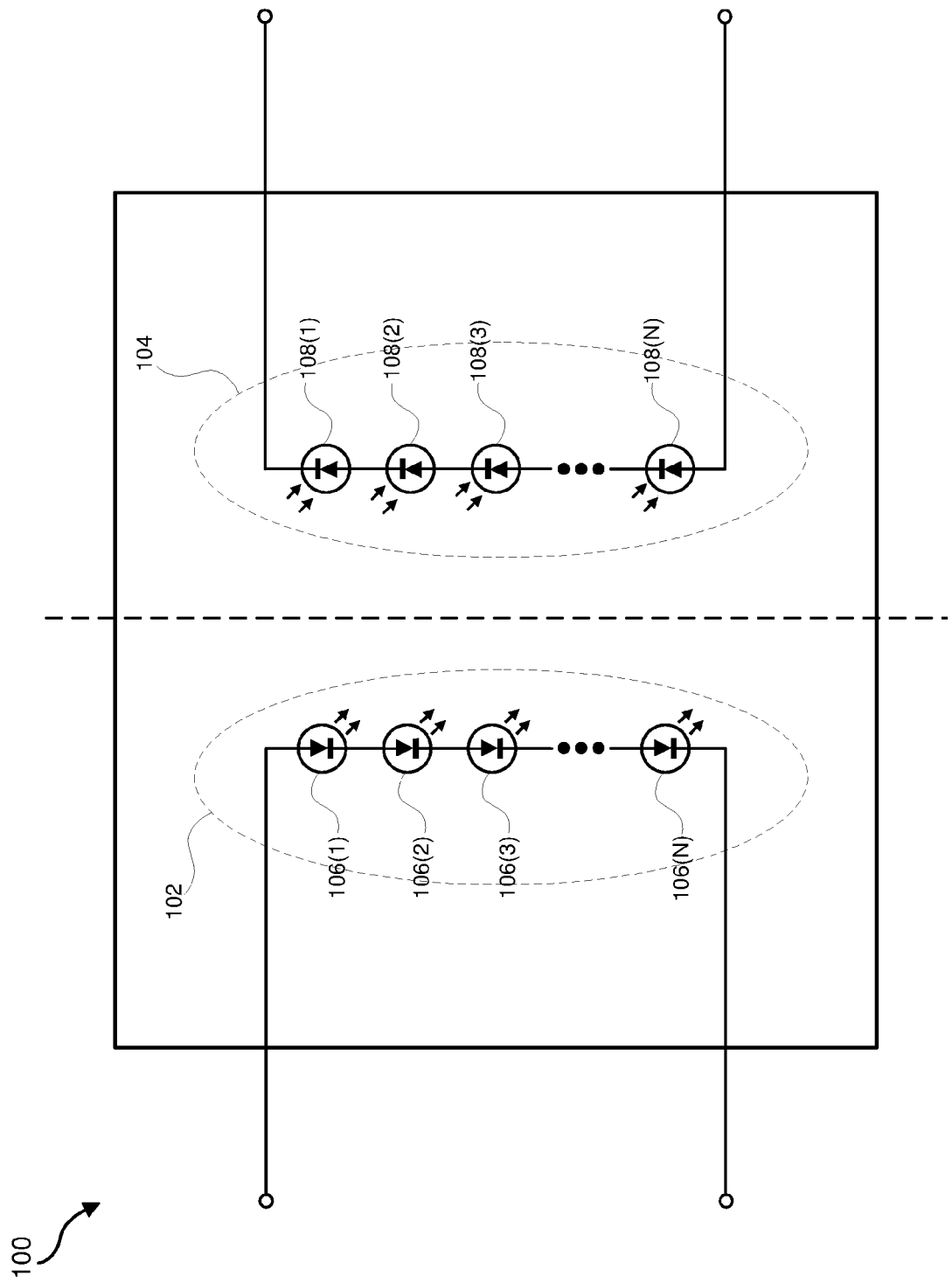
FIG. 1 is a schematic illustration of an exemplary optical transformer that facilitates optically transforming an Alternating Current (AC) electrical input into a Direct Current (DC) electrical output in accordance with various embodiments.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the present disclosure covers all modifications, equivalents, and alternatives falling within the scope of the appended claims.

DETAILED DESCRIPTION OF EXEMPLARY EMBODIMENTS

AC/DC transformers may be used to transform AC electrical inputs into DC electrical outputs. In one example, a traditional AC/DC transformer may be plugged into an AC power outlet to convert AC mains electricity into a DC electrical output. In this example, a household and/or consumer device may be electromagnetically coupled to the DC electrical output of the traditional AC/DC transformer. Through this electromagnetic coupling, the household and/or consumer device may be powered and/or charged by the DC electrical output of the AC/DC transformer.

Unfortunately, traditional AC/DC transformers may be bulky and/or unwieldy. For example, to achieve and/or provide the necessary degree of electrical isolation between the AC electrical input and the DC electrical output, a traditional AC/DC transformer may implement and/or rely on certain electrical components (e.g., inductors) and/or architectures that consume a significant amount of space and/or real estate. In other words, the traditional AC/DC transformer may represent and/or necessitate a fairly large physical footprint. As a result, the size of this traditional AC/DC transformer may be inconveniently and/or awkwardly large, thereby preventing the use of this traditional AC/DC transformer in tight spaces. The instant disclosure, therefore, identifies and addresses a need for improved apparatuses, systems, and methods for optically transforming AC electrical inputs into stepped-down DC outputs.

In some examples, the apparatuses, systems, and methods disclosed herein may implement, represent, and/or incorporate a step-down optical AC/DC transformer. For example, a step-down optical AC/DC transformer may include and/or form an optical coupling between an AC component and a DC component. In this example, the AC component of the step-down optical AC/DC transformer may include and/or represent an array of light-emitting devices, and the DC component of the step-down optical AC/DC transformer may include and/or represent an array of photovoltaic cells that are optically coupled to the array of light-emitting devices.

Continuing with this example, the AC component may receive AC electrical input that powers the array of light-emitting devices, which then produce light energy. As the array of photovoltaic cells are optically coupled to the array of light-emitting devices, the light energy may transfer from the array of light-emitting devices to the array of photovoltaic cells. Upon receiving the light energy from the array of light-emitting devices, the array of photovoltaic cells may convert the light energy into a DC electrical output capable of powering and/or charging a consumer device (such as a cell phone, a laptop, a tablet, a virtual reality headset, etc.).

In some examples, optical couplings may be formed by and/or with a combination of light-emitting devices and photovoltaic cells, whereas traditional electromagnetic couplings may be formed by and/or with an electromagnetic transformer core and/or conductive windings. The combination of light-emitting devices and photovoltaic cells may be significantly smaller and/or more compact than the equivalent electromagnetic transformer core and/or conductive windings. Moreover, the combination of light-emitting devices and photovoltaic cells may cost less than the equivalent electromagnetic transformer core and/or conductive windings. As a result, the step-down optical AC/DC transformers disclosed herein may be able to optically transform and/or convert AC inputs into stepped-down DC outputs while consuming less space than and/or costing less than traditional electromagnetic AC/DC transformers. These step-down optical AC/DC transformers may, therefore, represent an improvement and/or advantage over the bulkiness, unwieldiness, and/or costliness of traditional electromagnetic AC/DC transformers.

The following will provide, with reference to FIGS. 1-6, detailed descriptions of various apparatuses, systems, components, and/or implementations capable of optically transforming AC electrical inputs into stepped-down DC outputs. The discussion corresponding to FIGS. 7 and 8 will provide detailed descriptions of various waveforms related to optically transforming AC electrical inputs into stepped-down DC outputs. The discussion corresponding to FIG. 9 will provide detailed descriptions of an exemplary method for optically transforming AC electrical inputs into stepped-down DC outputs.

FIG. 1 is a schematic of an exemplary optical transformer 100 capable of optically transforming AC electrical inputs into stepped-down DC outputs. As illustrated in FIG. 1, exemplary optical transformer 100 may include and/or represent an array of light-emitting devices 102 and/or an array of photovoltaic cells 104. In one example, array of light-emitting devices 102 may include and/or represent light-emitting devices 106(1), 106(2), 106(3), and/or 106 (N). In this example, array of photovoltaic cells 104 may include and/or represent photovoltaic cells 108(1), 108(2), 108(3), and/or 108(N).

In some examples, array of light-emitting devices 102 may be configured and/or disposed to be electrically coupled to an AC power source (not illustrated in FIG. 1). In such examples, array of light-emitting devices 102 may be connected in series to one another. For example, the anode of light-emitting device 106(2) may be electrically coupled to the cathode of light-emitting device 106(1). In this example, the anode of light-emitting device 106(3) may be electrically coupled to the cathode of light-emitting device 106(2).

In some examples, array of photovoltaic cells 104 may be configured and/or disposed to produce a DC electrical output (not explicitly labelled in FIG. 1) from light energy transferred from array of light-emitting devices 102. In such examples, array of photovoltaic cells 104 may be connected in series to one another. For example, the anode of photovoltaic cell 108(2) may be electrically coupled to the cathode of photovoltaic cell 108(3). In this example, the anode of photovoltaic cell 108(1) may be electrically coupled to the cathode of photovoltaic cell 108(2).

In some examples, array of photovoltaic cells 104 may be optically coupled to array of light-emitting devices 102. For example, array of photovoltaic cells 104 may receive and/or obtain light energy transferred from array of light-emitting devices 102. In this example, array of photovoltaic cells 104 may transform and/or convert such light energy into a DC electrical output. Accordingly, array of photovoltaic cells 104 may generate and/or produce the DC electrical output from the light energy transferred from array of light-emitting devices 102.

In some examples, light-emitting devices 106(1)-(N) may each include and/or represent any type or form of device capable of producing, emitting, and/or transferring light energy. In one example, light-emitting devices 106(1)-(N) may each include and/or represent one or more Light-Emitting Diodes (LEDs) and/or laser diodes. Additional examples of light-emitting devices 106(1)-(N) include, without limitation, Vertical Cavity Surface Emitting Lasers (VCSELs), Vertical External Cavity Surface Emitting Laser (VECSELs), Resonant Cavity LEDs (RCLEDs), Organic LEDS (OLEDs), edge emitters, top or bottom emitters, lasers, surface-emitting lasers, Superluminescent LEDs (SLEDs), combinations or variations of one or more of the same, and/or any other suitable light-emitting devices.

In some examples, array of light-emitting devices 102 may each include and/or represent an indirect bandgap semiconductor or a direct bandgap semiconductor, such as Si, GaAs, InGaAs, AlGaAs, GaN, InGaN, AlGaN, GaP, GaAsP, AIGaInP, and the like. In one example, array of light-emitting devices 102 may be grouped, included, and/or incorporated in a single unit, element, and/or component. Additionally or alternatively, array of light-emitting devices 102 may include and/or represent a set or group of discrete units, elements, and/or components. Although not necessarily illustrated in this way in FIG. 1, optical transformer 100 may include one or more optical elements configured to enhance light extraction and focusing efficiency, such as one or more micro lenses, total internal reflection (TIR) concentrators and/or total internal reflection-refraction (TIR-R) concentrators.

In some examples, array of photovoltaic cells 104 may include and/or represent a plurality of individual photovoltaic elements. For example, the array may include and/or represent approximately 25, 50, 75, 100, 200 or more photovoltaic cells. Alternatively, the array may include and/or represent any number of photovoltaic cells that falls within the range of the foregoing values. Such an array may be able to generate and/or produce a DC electrical signal that is greater than the open circuit voltage of an individual photovoltaic element. For instance, the open circuit voltage of an array of N photovoltaic elements may be approximately N times the open circuit voltage of an individual photovoltaic element within the array.

In some examples, photovoltaic cells 108(1)-(N) may include and/or represent a p-n junction and/or p-i-n-junction within a semiconductor to obtain, generate, and/or produce an electric current from photons absorbed near the junction. In one example, photovoltaic cells 108(1)-(N) may each include and/or represent a photodiodes. Gallium arsenide (GaAs) may be employed and/or utilized as a direct bandgap material to facilitate high absorption of photons with an energy greater than its bandgap ($E_g$). Additional examples of direct bandgap materials include, without limitation, InGaAs, AlGaAs, GaN, InGaN, AlGaN, GaP, GaAsP, AIGaInP, and the like. In alternate examples, the photovoltaic cells may be manufactured from an indirect bandgap semiconductor such as silicon (Si). For instance, an example monolithic integrated micro photovoltaic cell array may include silicon, where the p-n junctions or p-i-n junctions are formed by lateral doping profiles.

An alternate approach to the development of array of photovoltaic cells 104 may involve the use of metal-semiconductor Schottky barriers to replace the semiconductor-semiconductor p-n junctions. Schottky barriers may be adaptable to economical, versatile manufacturing techniques and are suitable for polycrystalline-based devices. Additionally, since the collecting junction is located at the surface of the device, the collection efficiency through decreased surface recombination may be improved relative to a p-n junction. According to still further embodiments, array of photovoltaic cells 104 may include and/or represent quantum dots or a quantum well. In such embodiments, the bandgap of a quantum dot may be adjusted through a wide range of energy levels by changing the size of the dot.

Array of photovoltaic cells 104 may further include one or more bypass diodes (not necessarily illustrated in FIG. 1) connected in parallel to an individual cell or a grouping of cells to enable current flow through (around) unilluminated or damaged cells. Such bypass diodes may be integrated during wafer-level processing of the photodiodes or connected to the array as discrete elements.

In some embodiments, individual photovoltaic cells may include a compound semiconductor and/or be formed en masse during wafer-level processing. Alternatively, individual photovoltaic cells may be formed separately and then transferred (e.g., by pick-and-place or wafer bonding) to a carrier substrate.

In some examples, array of light-emitting devices 102 and array of photovoltaic cells 104 may be in direct contact with one another. In one example, an optical connector and/or guide may be disposed and/or applied between array of light-emitting devices 102 and array of photovoltaic cells 104 to direct and/or guide light energy from light-emitting devices 102 to photovoltaic cells 104. In this example, the optical connector and/or guide may include and/or represent any material suitable for guiding light. Such materials may include and/or represent glass, polymer, and/or semiconductor compositions.

In some examples, the optical connector and/or guide may include and/or incorporate crystalline or amorphous materials. Additionally or alternatively, the optical connector and/or guide may include and/or incorporate a gas or a liquid. The optical connector and/or guide may include and/or represent electrical insulation. In one example, to inhibit reflective losses, the optical connector and/or guide may be characterized by a refractive index of at least 1.5.

In some embodiments, array of light-emitting devices 102 may include N emitters, and array of photovoltaic cells 104 array may include N corresponding photovoltaic cells. In further embodiments, the number of light-emitting devices 106(1)-(N) may exceed the number of photovoltaic cells 108(1)-(N). In additional embodiments, the number of photovoltaic cells 108(1)-(N) may exceed the number of light-emitting devices 106(1)-(N). The optical connector and/or guide may further include a micro lens array or other elements configured to focus emitted light onto individual photovoltaic cells, e.g., onto a center of respective photovoltaic cells 108(1)-(N).

In some examples, light-emitting devices 106(1)-(N) may produce and/or emit a wavelength of light energy within a certain range. For example, light-emitting devices 106(1)-(N) may produce and/or emit a wavelength of light energy between 250 nanometers (nm) and 2,500 nm. Additionally or alternatively, light-emitting devices 106(1)-(N) may emit electromagnetic radiation with a wavelength from approximately 10 nm to approximately 1 mm, such as 10 nm, 20 nm, 50 nm, 100 nm, 200 nm, 300 nm, 400 nm, 500 nm, 600 nm, 700 nm, 800 nm, 900 nm, 1 micron (μm), 2 μm, 5 μm, 10 μm, 20 μm, 50 μm, 100 μm, 200 μm, 500 μm, or 1000 μm, including ranges between any of the foregoing values.

Although not illustrated in this way in FIG. 1, optical transformer 100 may include and/or incorporate additional electrical components that contribute to optically transforming AC electrical inputs into stepped-down DC outputs. For example, optical transformer 100 may include and/or incorporate filter circuitry that is electrically coupled to array of photovoltaic cells 104. In this example, the filter circuitry may include one or more capacitors (such as decoupling and/or bypass capacitors) that effectively smooth and/or filter the electric output of array of photovoltaic cells 104 to a nearly constant and/or pure DC signal.

In some examples, groups of photovoltaic cells may be connected in parallel to control (e.g., increase) the output current. That is, a photovoltaic cell array may include sub-arrays respectively configured in series and in parallel. Moreover, according to some embodiments, individual photovoltaic cells may be illuminated selectively to control the output voltage of the optical transformer. In certain embodiments, to improve the light absorption efficiency, the light source may have an emission spectrum selected to overlap the absorption profile of the photovoltaic cells.

In some examples, array of light-emitting devices 102 may each produce and/or emit a specific wavelength of light energy. In such examples, array of photovoltaic cells 104 may each have and/or exhibit an energy bandgap whose corresponding wavelength is within a certain range of the specific wavelength of light energy produced by array of light-emitting devices 102. As a specific example, light-emitting device 106(1) may produce and/or emit light energy of an approximately 500 nm wavelength. In this example, photovoltaic cell 108(1) may have and/or exhibit an energy bandgap whose corresponding wavelength is within 100 nm of the approximately 500 nm wavelength. Accordingly, photovoltaic cell 108(1) may have and/or exhibit an energy bandgap whose corresponding wavelength is between 400 and 600 nm.

In some embodiments, optical transformer 100 may include and/or incorporate one or more additional components that are not represented and/or illustrated in FIG. 1. For example, optical transformer 100 may include and/or incorporate one or more transistors, resistors, capacitors, inductors, and/or diodes, among other components. Some of these components may form and/or constitute filtering and/or smoothing circuitry that flattens and/or smoothens the DC electrical output of optical transformer 100.

Figure 2:
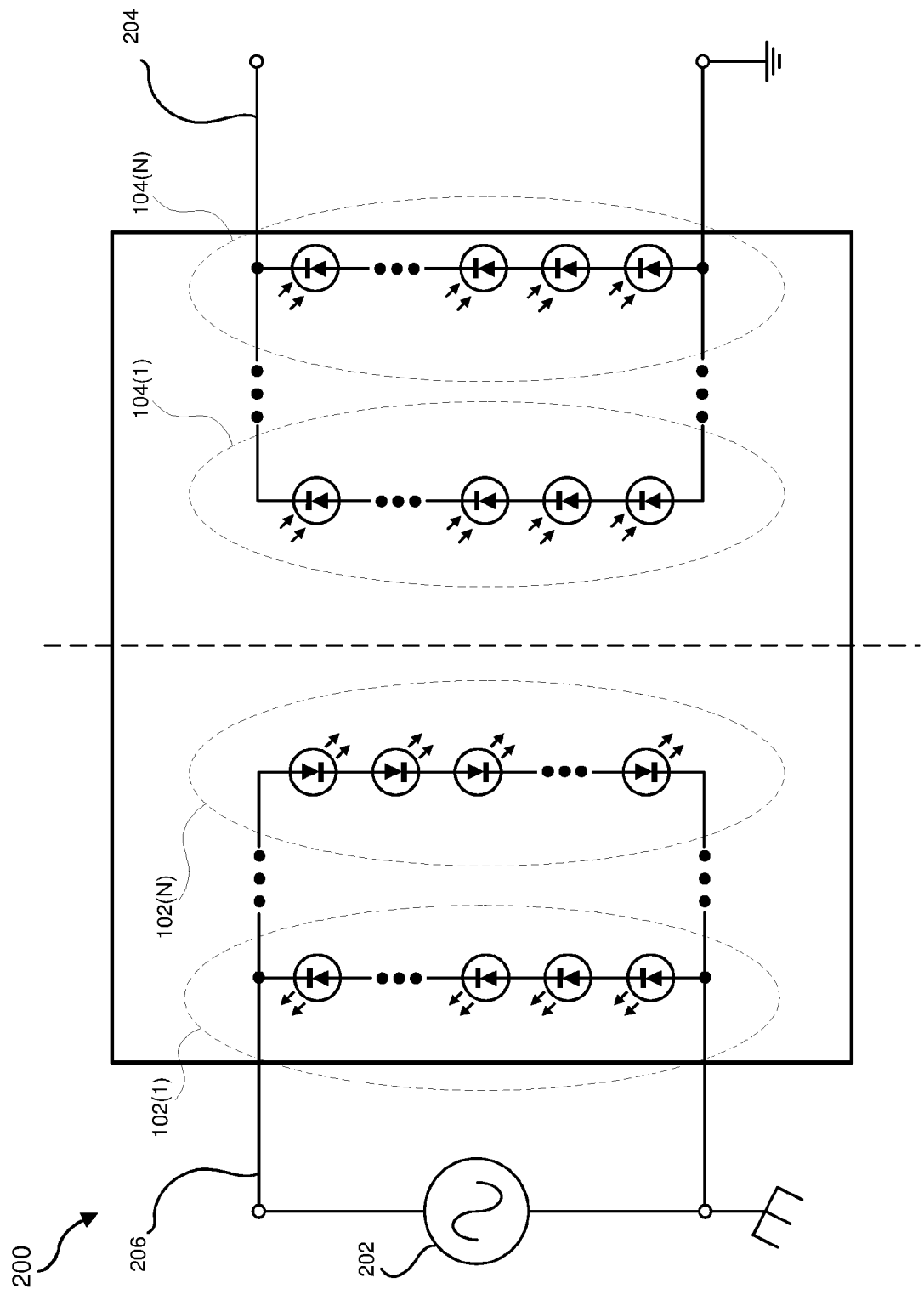
FIG. 2 is a schematic illustration of an additional exemplary optical transformer that optically transforms an AC electrical input into a DC electrical output in accordance with some embodiments.

FIG. 2 is a schematic of exemplary optical transformer 200 capable of optically transforming AC electrical inputs into stepped-down DC outputs. As illustrated in FIG. 2, exemplary optical transformer 200 may include and/or represent arrays of light-emitting devices 102(1)-(N) and/or arrays of photovoltaic cells 104(1)-(N). In this example, arrays of light-emitting devices 102(1)-(N) may be connected in parallel with one another. Additionally or alternatively, arrays of photovoltaic cells 104(1)-(N) may be connected in parallel with one another.

In some examples, array of light-emitting devices 102(1) may run, be oriented, and/or be arranged in one direction or polarity, while array of light-emitting devices 102(N) may run, be oriented, and/or be arranged in another direction or polarity. For example, array of light-emitting devices 102(1) may be arranged to conduct electric current from AC power source 202 when the voltage level of the AC electrical input provided and/or delivered by AC power source 202 is operating in the negative range and/or polarity (e.g., voltage levels between 0 and -110 volts). In this example, array of light-emitting devices 102(1) may draw electric current from a node 206 in FIG. 2 to produce and/or emit light energy only as the voltage level of the AC electrical input provided and/or delivered by AC power source 202 is operating in the negative range and/or polarity relative to ground. Accordingly, array of light-emitting devices 102(1) may block and/or reject electric current at node 206 in FIG. 2 to prevent the production and/or emission of light energy array of light-emitting devices 102(1) when the voltage level of the AC electrical input is within in the positive range and/or polarity relative to ground.

In contrast, array of light-emitting devices 102(N) may be arranged to conduct electric current from AC power source 202 when the voltage level of the AC electrical input provided and/or delivered by AC power source 202 is operating in the positive range and/or polarity (e.g., voltage levels between 0 and 110 volts). In this example, array of light-emitting devices 102(N) may draw electric current from node 206 in FIG. 2 to produce and/or emit light energy only as the voltage level of the AC electrical input provided and/or delivered by AC power source 202 is operating in the positive range and/or polarity relative to ground. Accordingly, array of light-emitting devices 102(N) may block and/or reject electric current at node 206 in FIG. 2 to prevent the production and/or emission of light energy from array of light-emitting devices 102(N) when the voltage level of the AC electrical input is within the negative range and/or polarity relative to ground.

As a result of their opposing polarities in FIG. 2, arrays of light-emitting devices 102(1) and 102(N) may effectively rectify the power provided and/or delivered by AC power source 202. For example, array of light-emitting devices 102(1) may produce and/or emit light energy when the voltage level of node 206 is below zero volts, and array of light-emitting devices 102(N) may produce and/or emit light energy when the voltage level of node 206 is above zero volts. In this example, arrays of photovoltaic cells 104(1)-(N) may be able to transform and/or convert such light energy into a positive DC electrical output irrespective of whether such light energy originates from array of light-emitting devices 102(1) or 102(N).

In some examples, each light-emitting device may have and/or exhibit a voltage drop. In one example, array of light-emitting devices 102 in FIG. 1 may have and/or exhibit a number of voltage drops that collectively amount to a total voltage drop across light-emitting devices 106(1)-(N) in FIG. 1. In this example, array of light-emitting devices 102 may be designed, configured, and/or tuned based at least in part on the peak value of the AC electrical input. For example, array of light-emitting devices 102 may be designed such that the total voltage drop across light-emitting devices 106(1)-(N) is equivalent and/or commensurate to the peak value of the AC electrical input.

In another example, array of light-emitting devices 102(1) in FIG. 2 may have and/or exhibit a number of voltage drops that collectively amount to a total voltage drop. In this example, array of light-emitting devices 102(1) may be designed, configured, and/or tuned based at least in part on the peak value of the AC electrical input. For example, array of light-emitting devices 102(1) may be designed such that the total voltage drop is equivalent and/or commensurate to the peak value of the AC electrical input.

As illustrated in FIG. 2, arrays of photovoltaic cells 104(1)-(N) may run, be oriented, and/or be arranged in the same polarity as one another. By doing so, arrays of photovoltaic cells 104(1)-(N) may be able to produce and/or generate a higher DC electrical output. For example, arrays of photovoltaic cells 104(1)-(N) may facilitate accumulating and/or increasing the amount of DC electrical output by summing up the constituent DC electrical signals generated by each individual array.

In some examples, arrays of light-emitting devices 102(1)-(N) may receive and/or obtain an AC electrical input from AC power source 202 via node 206. Arrays of light-emitting devices 102 may then produce and/or emit light energy from that AC electrical input. As arrays of photovoltaic cells 104(1)-(N) are optically coupled to arrays of light-emitting devices 102(1)-(N), the light energy produced and/or emitted by arrays of light-emitting devices 102(1)-(N) may travel and/or transfer to arrays of photovoltaic cells 104(1)-(N). Upon receiving the light energy, arrays of photovoltaic cells 104(1)-(N) may transform and/or convert the light energy into a DC electrical output 204 capable of powering and/or charging a consumer device. In one example, DC electrical output 204 may be stepped down and/or bucked from the AC electrical input. For example, the AC electrical input may include and/or represent a 110 or 220 volt AC signal, while DC electrical output 204 may include and/or represent a 3.3, 5, or 9 volt DC signal. Accordingly, the 3.3, 5, or 9 volt DC signal may be stepped down and/or bucked relative to the 110 or 220 volt AC signal.

Figure 3:
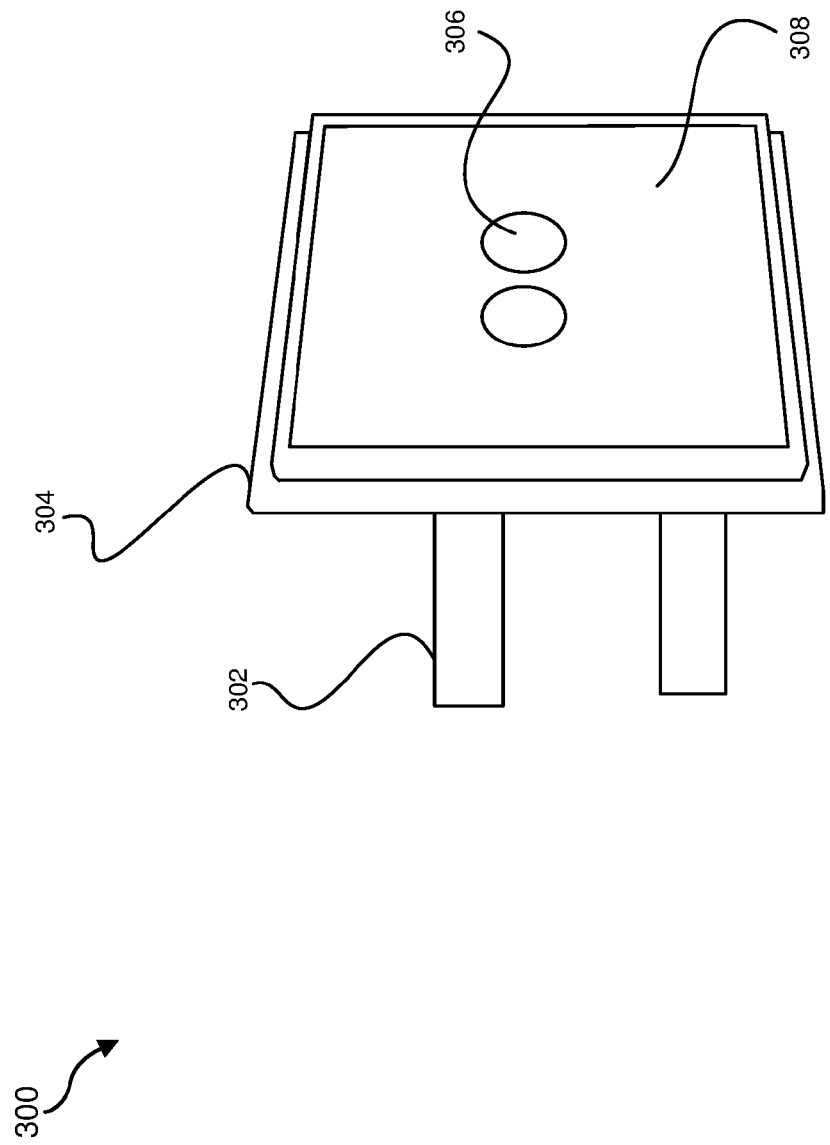
FIG. 3 is an illustration of an exemplary step-down optical AC/DC transformer that optically transforms and steps down an AC electrical input into a DC electrical output in accordance with some embodiments.
Figure 4:
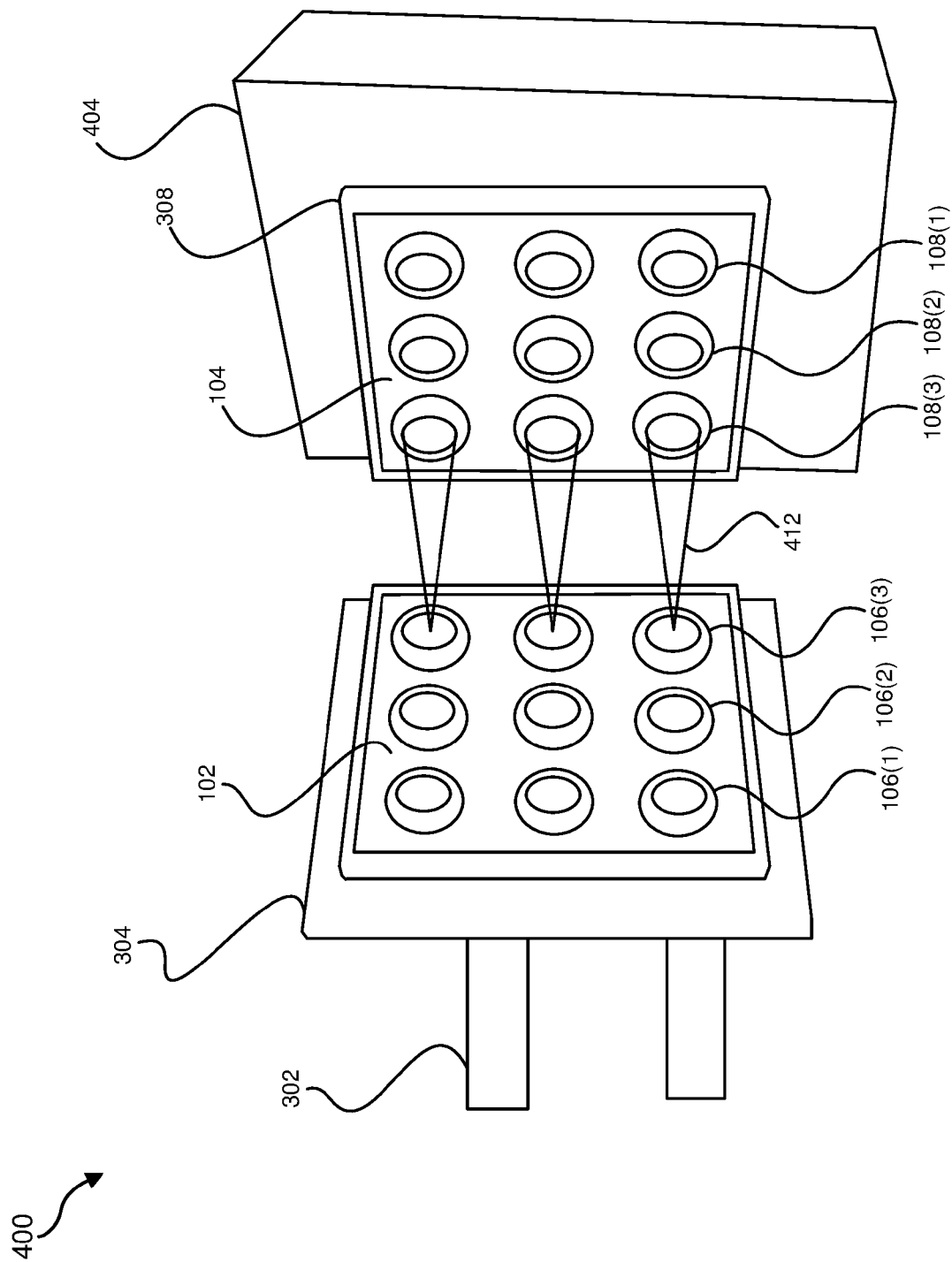
FIG. 4 is an illustration of an exemplary step-down optical AC/DC transformer that optically transforms and steps down an AC electrical input into a DC electrical output in accordance with some embodiments.

FIGS. 3 and 4 are illustrations of an exemplary optical transformer 300 and an exemplary optical transformer 400, respectively, that are both capable of optically transforming AC electrical inputs into stepped-down DC outputs. As illustrated in FIG. 3, exemplary optical transformer 300 may include and/or represent an AC component 304 and a DC component 308. In one example, AC component 304 may include and/or incorporate arrays of light-emitting devices 102(1)-(N) and/or an AC power plug 302. In this example, AC power plug 302 may be dimensioned for insertion into an AC power socket (not necessarily illustrated in FIG. 3). Additionally or alternatively, AC power plug 302 may facilitate electrically coupling array of light-emitting devices 102(1)-(N) to AC power source 202 via the AC power socket.

As illustrated in FIG. 3, DC component 308 may include and/or incorporate arrays of photovoltaic cells 104(1)-(N) and/or a charging port 306. In one example, charging port 306 may be dimensioned to receive and/or accept a charging plug of a portable computing device (not necessarily illustrated in FIG. 3). In this example, charging port 306 may facilitate electrically charging the portable computing device via the charging plug. For example, charging port 306 may include and/or represent a Universal Serial Bus (USB) port fitted to receive and/or accept a USB charging cable. In this example, optical transformer 300 may be able to charge a portable computing device (such as a cell phone, a laptop, a tablet, a virtual reality headset, etc.) via the USB charging cable.

Additionally or alternatively, DC component 308 may include and/or incorporate a DC power port dimensioned to receive and/or accept a DC power plug of a computing device (not necessarily illustrated in FIG. 3). In this example, the DC power port may facilitate powering the computing device via the DC power plug. For example, the DC power port may include and/or represent a coaxial power connector fitted to receive and/or accept a coaxial power cable. In this example, optical transformer 300 may be able to power a computing device (such as a cell phone, a laptop, a tablet, a virtual reality headset, etc.) via the coaxial power cable.

As illustrated in FIG. 3, AC component 304 and DC component 308 may be physically and/or optically coupled to one another. Additionally or alternatively, AC component 304 and DC component 308 may be electrically isolated and/or insulated from one another. As a result, while arrays of light-emitting devices 102(1)-(N) included in AC component 304 may be able to transfer light energy to arrays of photovoltaic cells 104(1)-(N) included in DC component 308, the electrical infrastructures and/or architectures of AC component 304 and DC component 308 may remain separate and/or isolated from one another.

As illustrated in FIG. 4, exemplary optical transformer 400 may, like optical transformer 300 in FIG. 3, include and/or represent AC component 304 and DC component 308. In one example, AC component 304 may include and/or incorporate array of light-emitting devices 102 and/or AC power plug 302. In this example, DC component 308 may include and/or incorporate array of photovoltaic cells 104 and/or be electrically coupled to a computing device 404 via a power and/or charging port. In this configuration, optical transformer 400 may be able to power and/or electrically charge computing device 404 via such a port.

In some examples, light-emitting device 106(3) incorporated into AC component 304 may be optically coupled to photovoltaic cell 108(3) incorporated into DC component 308. For example, light-emitting device 106(3) may produce and/or emit a beam of light energy 412 that travels and/or transfers to photovoltaic cell 108(3). In this example, photovoltaic cell 108(3) may receive the beam of light energy 412 from light-emitting device 106(3). Photovoltaic cell 108(3) may then transform and/or convert the beam of light energy 412 into a DC electrical signal.

The same type of optical coupling may be formed and/or applied between light-emitting devices 106(1)-(2) and photovoltaic cells 108(1)-(2), respectively. For example, light-emitting devices 106(1)-(2) may produce and/or emit beams of light energy that travel and/or transfer to photovoltaic cells 108(1)-(2), respectively. In this example, photovoltaic cells 108(1)-(2) may receive the beams of light energy from light-emitting devices 106(1)-(2), respectively. Photovoltaic cells 108(1)-(2) may then transform and/or convert the beams of light energy into DC electrical signals. These DC electrical signals, along with the one originating from photovoltaic cell 108(3), may contribute to the electrical output provided and/or delivered to computing device 404.

In some embodiments, DC component 308 may be incorporated into and/or represent part of computing device 404. For example, computing device 404 may include and/or incorporate DC component 308, which serves as an extension for plugging into and/or optically coupling to AC component 304. As a result, computing device 404 may be plugged into and/or optically coupled to AC component 304 via DC component 308.

Figure 5:
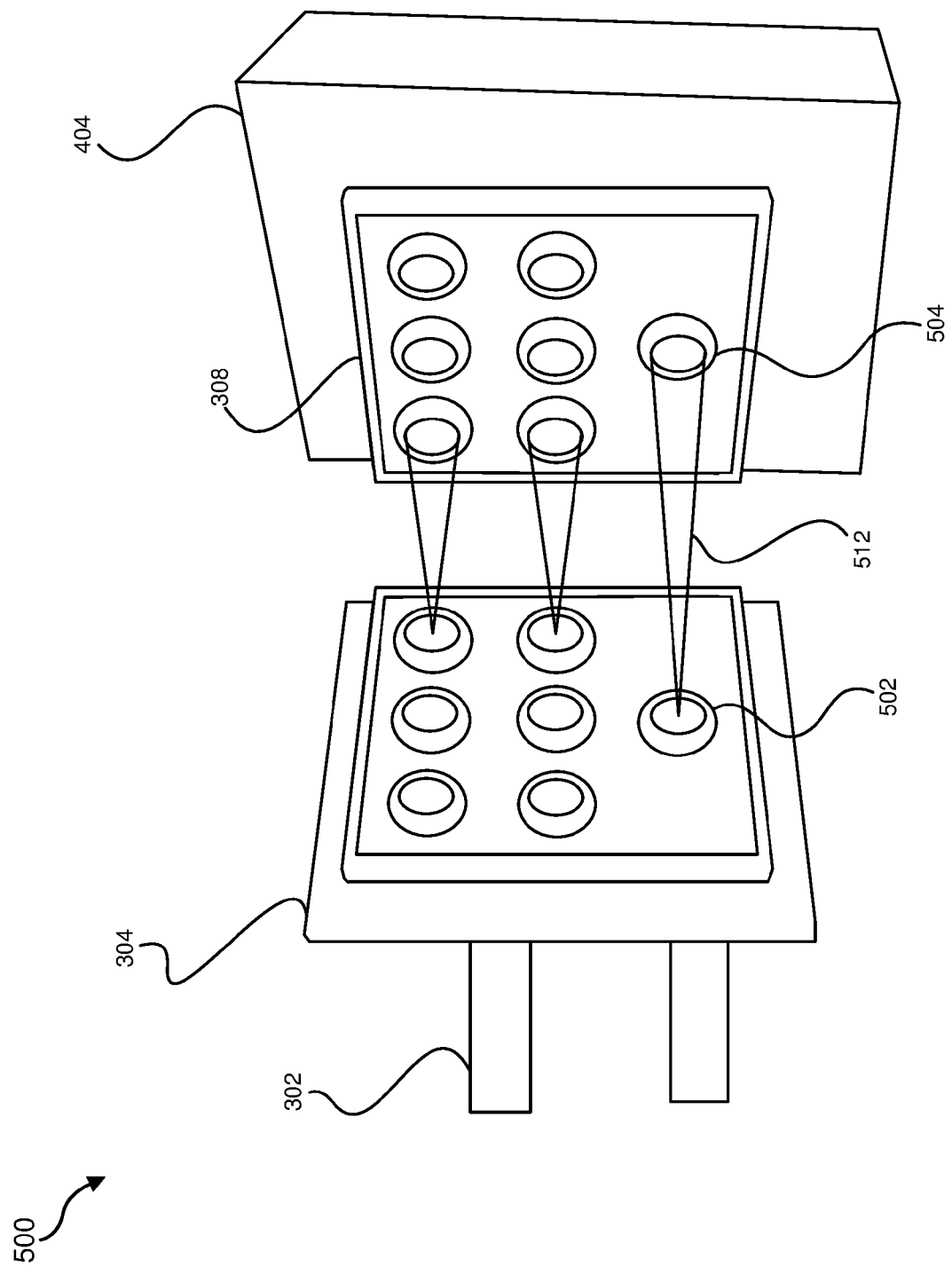
FIG. 5 is an illustration of an exemplary step-down optical AC/DC transformer that includes an optical transmitter/receiver pair for optically transmitting information from an AC component of the optical transformer to a DC component of the optical transformer.
Figure 6:
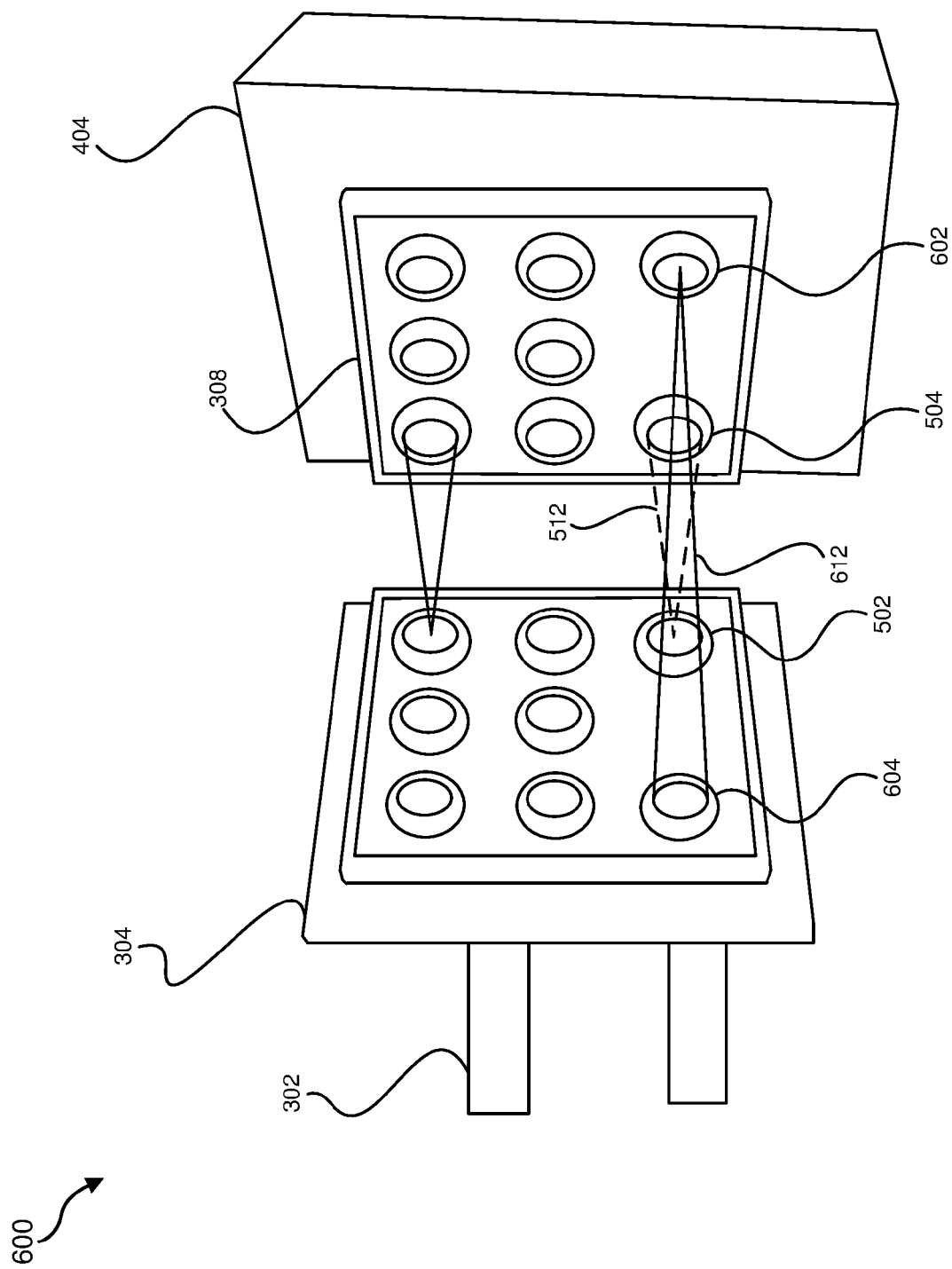
FIG. 6 is an illustration of an exemplary step-down optical AC/DC transformer that includes optical transceivers for optically exchanging information between an AC component of the optical transformer and a DC component of the optical transformer.

FIGS. 5 and 6 are illustrations of an exemplary optical transformer 500 and an exemplary optical transformer 600, respectively, that are both capable of optically transforming AC electrical inputs into stepped-down DC outputs. As illustrated in FIG. 5, exemplary optical transformer 500 may include and/or represent AC component 304 and DC component 308. In one example, AC component 304 may include and/or incorporate an array of light-emitting devices and/or AC power plug 302. In this example, DC component 308 may include and/or incorporate an array of photovoltaic cells and/or be electrically coupled to computing device 404 via a power and/or charging port. In this configuration, optical transformer 500 may be able to power and/or electrically charge computing device 404 via such a port.

In some examples, optical transformer 500 may include and/or incorporate a high-speed optical transmitter-receiver pair. For example, AC component 304 may include and/or incorporate an optical transmitter 502 that transmits a modulated light signal 512 that carries certain data and/or information. In this example, DC component 308 may include and/or incorporate an optical receiver 504 that receives modulated light signal 512 from optical transmitter 502. In one embodiment, optical transmitter 502 and/or optical receiver 504 may each be included in and/or represent part of an optical transceiver.

Modulated light signal 512 may be encoded with any type or form of data and/or information. In one example, modulated light signal 512 may be encoded with data and/or information indicating a power delivery capability of AC power source 202. In another example, modulated light signal 512 may be encoded with data and/or information used by computing device 404 plugged into optical transformer 500 during a powering and/or charging operation. In a further example, modulated light signal 512 may be encoded with data and/or information about advertisements to be displayed on computing device 404. Additionally or alternatively, modulated light signal 512 may be encoded with data and/or information pertinent to an Internet connection involving computing device 404 plugged into optical transformer 500.

As illustrated in FIG. 6, exemplary optical transformer 600 may include and/or represent AC component 304 and DC component 308. In one example, AC component 304 may include and/or incorporate an array of light-emitting devices and/or AC power plug 302. In this example, DC component 308 may include and/or incorporate an array of photovoltaic cells and/or be electrically coupled to computing device 404 via a power and/or charging port. In this configuration, optical transformer 600 may be able to power and/or electrically charge computing device 404 via such a port.

In some examples, optical transformer 600 may include and/or incorporate a high-speed optical transceiver pair. For example, AC component 304 may include and/or incorporate optical transmitter 502 that transmits a modulated light signal 512 that carries certain data and/or information to optical receiver 504 incorporated into DC component 308. In this example, DC component 308 may include and/or incorporate an optical transmitter 602 that transmits a modulated light signal 612 that carries certain data and/or information. Additionally or alternatively, AC component 304 may include and/or incorporate an optical receiver 604 that receives modulated light signal 612 from optical transmitter 602. In one embodiment, the combination of optical transmitter 502 and optical receiver 604 may form and/or constitute an optical transceiver of AC component 304, and the combination of optical transmitter 602 and optical receiver 504 may form and/or constitute an optical transceiver of DC component 308.

Like modulated light signal 512, modulated light signal 612 may be encoded with any type or form of data and/or information. In this configuration, modulated light signals 512 and 612 may include and/or represent data and/or information transferred as part of a Power Line Communication (PLC) network and/or a Broadband over Power Lines (BPL) network. In one example, modulated light signals 512 and 612 may be encoded with data and/or information pertinent to an Internet connection involving computing device 404 plugged into optical transformer 600. In another example, modulated light signal 612 may be encoded with a device key indicative and/or representative of computing device 404 plugged into optical transformer 600. In this example, optical transformer 600 may opt to grant or deny access to its power and/or charging capabilities based at least in part on the device key and/or the corresponding authentication.

Figure 7:
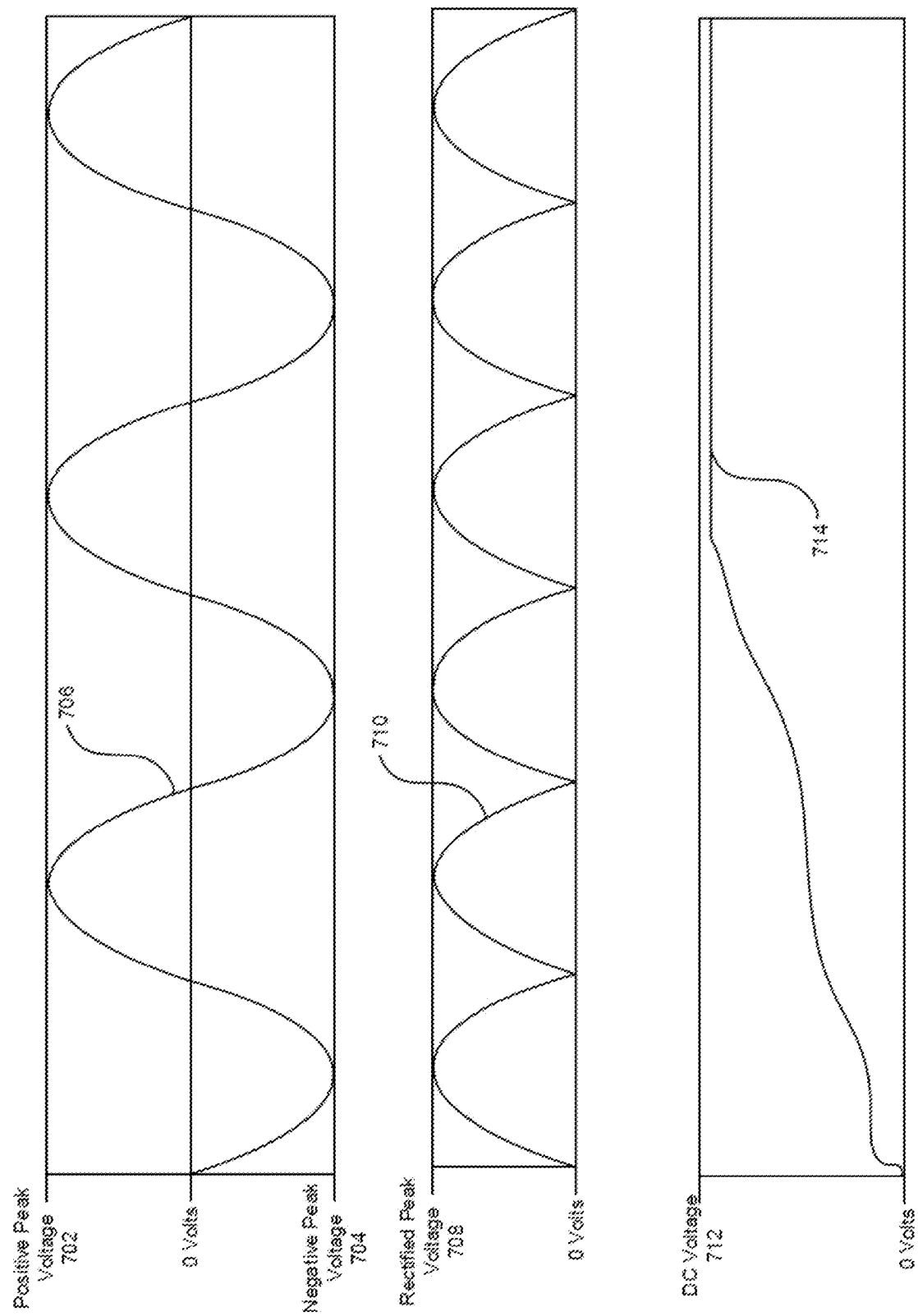
FIG. 7 is an illustration of an exemplary AC electrical input of an optical transformer, an exemplary rectified electrical signal of the optical transformer, and an exemplary DC electrical output of the optical transformer.

FIG. 7 is an illustration of an exemplary AC electrical input 706, an exemplary rectified output signal 710, an exemplary DC electrical output 714. As illustrated in FIG. 7, AC electrical input 706 may have and/or exhibit a positive peak voltage 702 and/or a negative peak voltage 704. In one example, array of light-emitting devices 102(1)-(N) may receive AC electrical input 706 in FIG. 7. In this example, array of light-emitting devices 102(1)-(N) may produce and/or emit light energy based at least in part on AC electrical input 706.

In one example, array of photovoltaic cells 104(1)-(N) may receive the light energy produced and/or emitted by array of light-emitting devices 102(1)-(N). In this example, array of photovoltaic cells 104(1)-(N) may transform and/or convert the light energy into rectified output signal 710 in FIG. 7. As illustrated in FIG. 7, rectified output signal 710 may have and/or exhibit a rectified peak voltage 708.

In one example, the optical transformer may include and/or incorporate filter circuitry that is electrically coupled to array of photovoltaic cells 104(1)-(N). In this example, the filter circuitry may include one or more capacitors (such as decoupling and/or bypass capacitors) that effectively smooth and/or filter rectified output signal 710 to a DC electrical signal 714. As illustrated in FIG. 7, DC electrical signal 714 may have and/or exhibit a nearly constant and/or pure DC voltage 712.

Figure 8:
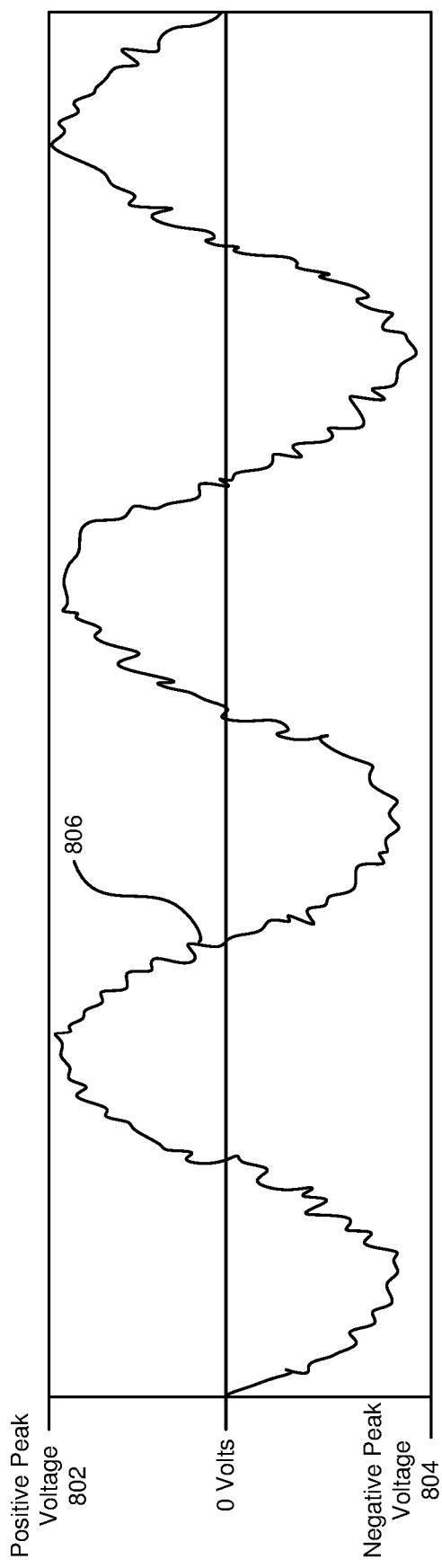
FIG. 8 is an illustration of an exemplary modulated AC electrical input that carries information from an AC component of an optical transformer to a DC component of the optical transformer.

FIG. 8 is an illustration of an exemplary AC power signal 806 received by optical transformer 600 in FIG. 6. As illustrated in FIG. 8, AC power signal 806 may have and/or exhibit a low-frequency component and a high-frequency component. In one example, the low-frequency component may constitute and/or represent the standard and/or nominal frequency for AC power transmissions. In this example, the high-frequency component may constitute and/or represent encoded data and/or information intended for transmission to an optical transformer with a high-speed transmitter-receiver pair. Accordingly, AC power signal 806 may constitute and/or represent a modulated AC power signal capable of providing electric current to the optical transformer's array of light-emitting devices and transferring data and/or information to the optical transformer or a computing device electrically coupled to the optical transformer.

In some examples, the optical transformer may filter and/or distinguish the low-frequency component from the high-frequency component. By doing so, the optical transformer may be able to generate and/or relay a modulated light signal across the transformer's optical coupling as well as power the array of light-emitting devices. For example, the modulated light signal may be encoded with data and/or information transferred to the optical transformer via the high-frequency component of AC power signal 806. In this example, the array of light-emitting devices may be powered by the low-frequency component of AC power signal 806.

Figure 9:
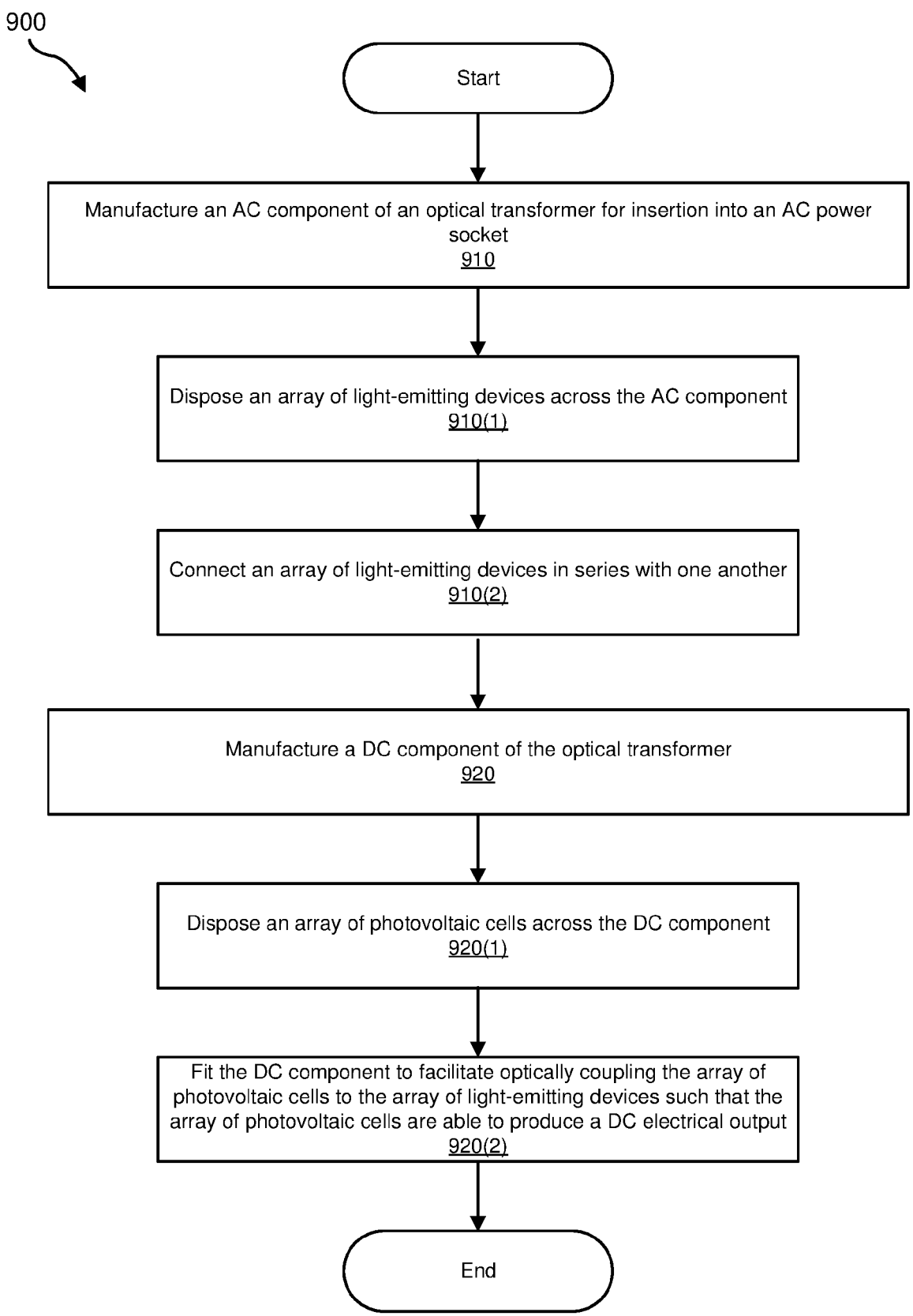
FIG. 9 is a flow diagram of an exemplary method for optically transforming AC electrical inputs into stepped-down DC outputs.

FIG. 9 is a flow diagram of an exemplary method 900 for optically transforming AC electrical inputs into stepped-down DC outputs. In one example, the steps shown in FIG. 9 may be performed as part of manufacturing and/or assembling an optical transformer. Additionally or alternatively, the steps shown in FIG. 9 may also incorporate and/or involve various sub-steps and/or variations consistent with the descriptions provided above in connection with FIGS. 1-8.

As illustrated in FIG. 9, method 900 may include a step 910 in which an AC component of an optical transformer is manufactured for insertion into an AC power socket. In one example, a transformer manufacturer or subcontractor may manufacture, construct, and/or assemble an AC component of an optical transformer for insertion into an AC power socket. For example, the transformer manufacturer or subcontractor may dispose and/or solder an array of light-emitting devices across a circuit board of the AC component (sub-step 910(1)). In this example, the transformer manufacturer or subcontractor may connect and/or electrically couple the array of light-emitting devices in series (sub-step 910(2)) and/or parallel with one another.

As illustrated in FIG. 9, method 900 may also include a step 920 in which a DC component of the optical transformer is manufactured. In one example, the transformer manufacturer or subcontractor may manufacture, construct, and/or assemble a DC component of the optical transformer. For example, the transformer manufacturer or subcontractor may dispose and/or solder an array of photovoltaic cells across a circuit board of the DC component (sub-step 920(1)). In this example, the transformer manufacturer or subcontractor may fit the DC component to facilitate optically coupling the array of photovoltaic cells to the array of light-emitting devices such that the array of photovoltaic cells are able to produce a DC electrical output (sub-step 920(2)) from light energy emitted by the array of light-emitting devices.

As explained above in connection with FIGS. 1-9, a step-down optical AC/DC transformer may be able to optically transform and/or convert AC electrical inputs into stepped-down DC outputs. As a specific example, the step-down optical AC/DC transformer may have and/or take the form of plug fitted for insertion into an AC wall outlet. In this example, upon being inserted into such an AC wall outlet, the step-down optical AC/DC transformer may receive an AC mains signal via the AC wall outlet.

As the AC mains signal reaches the AC wall outlet, the step-down optical AC/DC transformer may provide and/or deliver electric current from the AC mains signal to an array of light-emitting devices that produce and/or emit light energy. The array of light-emitting devices may be optically coupled to array of photovoltaic cells that receive the light energy. Upon receiving such light energy from the light-emitting devices, the photovoltaic cells may transform and/or convert the light energy into a DC electrical output. The step-down optical AC/DC transformer may then provide and/or deliver the DC electrical output to a computing device for power and/or charging purposes.

Example Embodiments

Example 1: An optical transformer comprising (1) an array of light-emitting devices that are disposed to be electrically coupled to an alternating current (AC) power source; and are connected in series with one another and (2) an array of photovoltaic cells that are optically coupled to the array of light-emitting devices and produce a direct current (DC) electrical output.

Example 2: The optical transformer of Example 1, further comprising an additional array of light-emitting devices that are connected in series with one another and are connected in parallel with the array of light-emitting devices.

Example 3: The optical transformer of Example 2, wherein the array of light-emitting devices are arranged to conduct electric current from the AC power source in one polarity and the additional array of light-emitting devices are arranged to conduct electric current from the AC power source in another polarity that is opposite of the one polarity.

Example 4: The optical transformer of Example 1, wherein the array of photovoltaic cells are connected in series with one another, and further comprising an additional array of photovoltaic cells that are connected in series with one another and are connected in parallel with the array of photovoltaic cells.

Example 5: The optical transformer of Example 1, further comprising an AC power plug that is dimensioned for insertion into an AC power socket and facilitates electrically coupling the array of light-emitting devices to the AC power source via the AC power socket.

Example 6: The optical transformer of Example 1, wherein the array of light-emitting devices are arranged to rectify the AC power source by conducting electric current from the AC power source in one polarity and blocking electric current from the AC power source in another polarity that is opposite of the one polarity.

Example 7: The optical transformer of Example 1, wherein the array of light-emitting devices receives an AC electrical input from the AC power source and the DC electrical output produced by the photovoltaic cells is stepped down from the AC electrical input received by the array of light-emitting devices.

Example 8: The optical transformer of Example 1, further comprising a charging port that is dimensioned to receive a charging plug of a portable computing device; and facilitates electrically charging the portable computing device via the charging plug.

Example 9: The optical transformer of Example 1, further comprising a DC power port that is dimensioned to receive a DC power plug of a computing device and facilitates powering the computing device via the DC power plug.

Example 10: The optical transformer of Example 1, wherein the array of light-emitting devices exhibit a plurality of voltage drops that collectively amount to a total voltage drop across the array of light-emitting devices and the array of light-emitting devices receives an AC electrical input from the AC power source, the AC electrical input having a peak value equivalent to the total voltage drop across the array of light-emitting devices.

Example 11: The optical transformer of any of Example 1, further comprising an AC component that incorporates the array of light-emitting devices and a DC component that is physically coupled to the AC component and incorporates the array of photovoltaic cells.

Example 12: The optical transformer of Example 11, wherein the AC component includes an optical transmitter that transmits a modulated light signal carrying information and the DC component includes an optical receiver that receives the modulated light signal carrying the information from the optical transmitter.

Example 13: The optical transformer of Example 12, wherein the information carried by the modulated light signal comprises at least one of information indicating a power delivery capability of the AC power source, information used by a computing device plugged into the optical transformer to authenticate the optical transformer, information about advertisements to be displayed on a computing device plugged into the optical transformer during a charging operation, or information pertinent to an Internet connection involving a computing device plugged into the optical transformer.

Example 14: The optical transformer of Example 11, wherein the DC component includes an optical transmitter that transmits a modulated light signal carrying information and the AC component includes an optical receiverthat receives the modulated light signal carrying the information from the optical transmitter.

Example 15: The optical transformer of Example 14, wherein the information carried by the modulated light signal comprises at least one of information pertinent to an Internet connection involving a computing device plugged into the optical transformer or a device key indicative of a computing device plugged into the optical transformer.

Example 16: The optical transformer of Example 11, wherein the DC component is incorporated into a computing device that is electrically charged via the DC electrical output.

Example 17: The optical transformer of Example 1, wherein the array of light-emitting devices comprise at least one of a plurality of light-emitting diodes, a plurality of laser diodes, or a plurality of surface-emitting lasers.

Example 18: The optical transformer of Example 1, wherein the array of light-emitting devices produce a specific wavelength of light energy and the array of photovoltaic cells have an energy bandgap whose corresponding wavelength is within a certain range of the specific wavelength of light energy produced by the array of light-emitting devices.

Example 19: A pluggable optical transformer comprising (1) an alternating current (AC) component that includes an AC power plug dimensioned for insertion into an AC power socket and includes an array of light-emitting devices that are disposed to be electrically coupled to the AC power socket and are connected in series with one another and (2) a direct current (DC) component that is dimensioned for physically coupling to the AC component and includes an array of photovoltaic cells that are dimensioned for optically coupling to the array of light-emitting devices included on the AC component and produce a direct current (DC) electrical output.

Example 20: A method comprising (1) assembling an alternating current (AC) component of an optical transformer for insertion into an AC power socket by disposing an array of light-emitting devices across the AC component and connecting the array of light-emitting devices in series with one another and (2) assembling a direct current (DC) component of the optical transformer by disposing an array of photovoltaic cells across the DC component and fitting the DC component to facilitate optically coupling the array of photovoltaic cells to the array of light-emitting devices such that the array of photovoltaic cells are able to produce a DC electrical output.

In certain embodiments, one or more of the modules described herein may transform data, physical devices, and/or representations of physical devices from one form to another. For example, one or more of the modules recited herein may receive, at a computing device, a compressed video bitstream that includes video data and in-band metadata that indicates a video quality of the compressed video bitstream and perform a decoding and/or transcoding operation on the compressed video bitstream such that the video data is transformed from an encoded version to a decoded version. Additionally or alternatively, one or more of the modules described herein may transform a processor, volatile memory, non-volatile memory, and/or any other portion of a physical computing device from one form to another by executing on the computing device, storing data on the computing device, and/or otherwise interacting with the computing device.

In some embodiments, the term "computer-readable medium" generally refers to any form of device, carrier, or medium capable of storing or carrying computer-readable instructions. Examples of computer-readable media include, without limitation, transmission-type media, such as carrier waves, and non-transitory-type media, such as magnetic-storage media (e.g., hard disk drives, tape drives, and floppy disks), optical-storage media (e.g., Compact Disks (CDs), Digital Video Disks (DVDs), and BLU-RAY disks), electronic-storage media (e.g., solid-state drives and flash media), and other distribution systems.

Embodiments of the instant disclosure may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An optical transformer comprising:
   an alternating current (AC) component that incorporates:
      an array of light-emitting devices that:
         are electrically coupled between a ground node and an electrical node configured to carry electric current from an AC power source; and
         are connected in series with one another;
      at least one additional array of light-emitting devices that:
         are electrically coupled between the ground node and the electrical node;
         are connected in series with one another and in parallel with the array of light-emitting devices; and
         are arranged along a vertical plane within the AC component; and
      an optical transmitter that transmits a modulated light signal carrying information; and
   a direct current (DC) component that is optically coupled to the AC component and incorporates:
      an array of photovoltaic cells that:
         are optically coupled to the array of light-emitting devices via beams of light energy;
         each produce a constituent DC electrical signal;
         are arranged to accumulate the constituent DC electrical signals into a DC electrical output;
         are arranged along a vertical plane within the DC component; and
         include a certain number of photovoltaic cells designed to produce the DC electrical output at a specific voltage level sufficient to power or charge a consumer device; and
      an optical receiver that receives the modulated light signal carrying the information from the optical transmitter via a transmission beam that is external to the beams of light energy; and
   wherein the optical transformer comprises a form factor that fits in tight spaces, the form factor being dimensioned such that the vertical planes within the AC and DC components are at least twice as long as a horizontal plane that is orthogonal to the vertical planes and spans across the AC and DC components.

2. The optical transformer of claim 1, wherein:
   the array of light-emitting devices are arranged to conduct electric current from the AC power source in one polarity; and
   the at least one additional array of light-emitting devices are arranged to conduct electric current from the AC power source in another polarity that is opposite of the one polarity.

3. The optical transformer of claim 2, wherein:
   the array of light-emitting devices are arranged to rectify the AC power source by blocking electric current from the AC power source in the another polarity; and
   the at least one additional array of light-emitting devices are arranged to rectify the AC power source by blocking electric current from the AC power source in the one polarity.

4. The optical transformer of claim 1, wherein the array of photovoltaic cells are connected in series with one another; and
   further comprising at least one additional array of photovoltaic cells that:
      are connected in series with one another; and
      are connected in parallel with the array of photovoltaic cells.

5. The optical transformer of claim 1, further comprising an AC power plug that:
   is dimensioned for insertion into an AC power socket; and
   facilitates electrically coupling the array of light-emitting devices to the AC power source via the AC power socket.

6. The optical transformer of claim 1, wherein:
   the array of light-emitting devices receives an AC electrical input from the AC power source; and the DC electrical output produced by the array of photovoltaic cells is stepped down from the AC electrical input received by the array of light-emitting devices.

7. The optical transformer of claim 1, further comprising a charging port that:
   is dimensioned to receive a charging plug of a portable computing device; and
   facilitates electrically charging the portable computing device via the charging plug.

8. The optical transformer of claim 1, further comprising a DC power port that:
   is dimensioned to receive a DC power plug of a computing device; and
   facilitates powering the computing device via the DC power plug.

9. The optical transformer of claim 1, wherein:
   the array of light-emitting devices exhibit a plurality of voltage drops that collectively amount to a total voltage drop across the array of light-emitting devices; and
   the array of light-emitting devices receives an AC electrical input from the AC power source, wherein the AC electrical input has a peak value equivalent to the total voltage drop across the array of light-emitting devices.

10. The optical transformer of claim 1, wherein the information carried by the modulated light signal comprises at least one of:
    information indicating a power delivery capability of the AC power source;
    information used by a computing device plugged into the optical transformer to authenticate the optical transformer;
    information about advertisements to be displayed on a computing device plugged into the optical transformer during a charging operation; or
    information pertinent to an Internet connection involving a computing device plugged into the optical transformer.

11. The optical transformer of claim 1, wherein:
    the DC component includes an additional optical transmitter that transmits an additional modulated light signal carrying additional information; and
    the AC component includes an additional optical receiver that receives the additional modulated light signal carrying the additional information from the additional optical transmitter.

12. The optical transformer of claim 11, wherein the additional information carried by the additional modulated light signal comprises at least one of:
    information pertinent to a bidirectional data connection involving the consumer device; or
    a device key indicative of the consumer device.

13. The optical transformer of claim 1, wherein the DC component is incorporated into the consumer device.

14. The optical transformer of claim 1, wherein the array of light-emitting devices comprise at least one of:
    a plurality of light-emitting diodes;
    a plurality of laser diodes; or
    a plurality of surface-emitting lasers.

15. The optical transformer of claim 1, wherein:
    the array of light-emitting devices produce a specific wavelength of light energy; and
    the array of photovoltaic cells have an energy bandgap whose corresponding wavelength is within a certain range of the specific wavelength of light energy produced by the array of light-emitting devices.

16. A pluggable optical transformer comprising:
    an alternating current (AC) component that:
       includes an AC power plug dimensioned for insertion into an AC power socket; and
       includes an array of light-emitting devices that:
          are electrically coupled between a ground node and an electrical node configured to carry electric current from an AC power source; and
          are connected in series with one another; includes at least one additional array of light-emitting devices that:
          are electrically coupled between the ground node and the electrical node;
          are connected in series with one another and in parallel with the array of light-emitting devices; and
          are arranged along a vertical plane within the AC component; and
       includes an optical transmitter that transmits a modulated light signal carrying information; and
    a direct current (DC) component that:
       is dimensioned for optically coupling to the AC component;
       includes an array of photovoltaic cells that:
          are dimensioned for optically coupling to the array of light-emitting devices included on the AC component via beams of light energy;
          each produce a constituent direct current (DC) electrical signal;
          are arranged to accumulate the constituent DC electrical signals into a DC electrical output;
          are arranged along a vertical plane within the DC component; and
          include a certain number of photovoltaic cells designed to produce the DC electrical output at a specific voltage level sufficient to power or charge a consumer device; and
       includes an optical receiver that receives the modulated light signal carrying the information from the optical transmitter via a transmission beam that is external to the beams of light energy; and
    wherein the optical transformer comprises a form factor that fits in tight spaces, the form factor being dimensioned such that the vertical planes within the AC and DC components are at least twice as long as a horizontal plane that is orthogonal to the vertical planes and spans across the AC and DC components.

17. A method comprising:
    manufacturing an alternating current (AC) component of an optical transformer for insertion into an AC power socket by:
       electrically coupling, across the AC component, an array of light-emitting devices between a ground node and an electrical node configured to carry electric current from an AC power source;
       connecting the array of light-emitting devices in series with one another;
       electrically coupling, across the AC component, an additional array of light-emitting devices between the ground node and the electrical node;
       connecting the additional array of light-emitting devices in series with one another and in parallel with the array of light-emitting devices;
       arranging the array of light-emitting devices and the additional array of light-emitting devices along a vertical plane within the AC component; and
       incorporating an optical transmitter configured to transmit a modulated light signal carrying information; and
    manufacturing a direct current (DC) component of the optical transformer by:
       disposing an array of photovoltaic cells across the DC component, wherein the array of photovoltaic cells:

each produce a constituent direct current (DC) electrical signal;
are arranged to accumulate the constituent DC electrical signals into a DC electrical output;
are arranged along a vertical plane within the DC component; and
include a certain number of photovoltaic cells designed to produce the DC electrical output at a specific voltage level sufficient to power or charge a consumer device;

fitting the DC component to facilitate optically coupling the array of photovoltaic cells to the array of light-emitting devices via beams of light energy; and incorporating an optical receiver configured to receive the modulated light signal carrying the information from the optical transmitter via a transmission beam that is external to the beams of light energy; and wherein the optical transformer comprises a form factor that fits in tight spaces, the form factor being dimensioned such that the vertical planes within the AC and DC components are at least twice as long as a horizontal plane that is orthogonal to the vertical planes and spans across the AC and DC components.

* * * * *